(12) United States Patent
Flachowsky et al.

(10) Patent No.: US 9,129,843 B1
(45) Date of Patent: Sep. 8, 2015

(54) INTEGRATED INDUCTOR

(71) Applicant: GLOBALFOUNDRIES Inc., Grand Cayman (KY)

(72) Inventors: Stefan Flachowsky, Dresden (DE); Ralf Richter, Radebeul (DE); Peter Javorka, Radeburg (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/302,880

(22) Filed: Jun. 12, 2014

(51) Int. Cl.
| | |
|---|---|
| *H01F 17/00* | (2006.01) |
| *H01L 49/02* | (2006.01) |
| *H01L 21/263* | (2006.01) |
| *H01L 21/762* | (2006.01) |
| *H01L 27/06* | (2006.01) |
| *H01L 29/06* | (2006.01) |
| *B23K 26/00* | (2014.01) |
| *B23K 26/38* | (2014.01) |

(52) U.S. Cl.
CPC ............ *H01L 28/10* (2013.01); *B23K 26/0042* (2013.01); *B23K 26/0057* (2013.01); *B23K 26/38* (2013.01); *H01L 21/263* (2013.01); *H01L 21/76224* (2013.01); *H01L 27/0617* (2013.01); *H01L 29/0653* (2013.01)

(58) Field of Classification Search
CPC ... H01L 28/10; H01L 23/5227; H01L 23/645; H01L 2924/30107; H01F 17/0006; H01F 17/02; Y10T 29/4902; B23K 26/0042; B23K 26/0057; B23K 26/365; B23K 26/38

USPC ............... 257/379, 531; 438/3, 381; 336/200; 29/602.1
See application file for complete search history.

(56) References Cited

U.S. PATENT DOCUMENTS

| | | | | |
|---|---|---|---|---|
| 3,547,074 | A | * | 12/1970 | Hirschfeld .................... 118/665 |
| 4,449,051 | A | * | 5/1984 | Berkowitz ................. 250/492.2 |
| 4,494,100 | A | * | 1/1985 | Stengel et al. ................. 336/200 |
| 4,644,126 | A | * | 2/1987 | Schumacher .............. 219/121.4 |
| 5,164,361 | A | * | 11/1992 | Aprigliano et al. ........... 505/433 |
| 5,175,140 | A | * | 12/1992 | Fujita et al. ................... 505/120 |
| 6,716,693 | B1 | | 4/2004 | Chan et al. .................... 438/238 |
| 7,750,250 | B1 | * | 7/2010 | Kuo .............................. 174/264 |
| 7,958,626 | B1 | * | 6/2011 | Karim et al. .................... 29/832 |
| 2003/0215204 | A1 | * | 11/2003 | Schroeder et al. ............ 385/132 |

(Continued)

FOREIGN PATENT DOCUMENTS

| | | | | |
|---|---|---|---|---|
| JP | H1-245518 | * | 9/1989 | ............ H01L 21/265 |
| JP | H1-316472 | * | 12/1989 | ................ C23F 4/00 |

(Continued)

OTHER PUBLICATIONS

Machine translation, Abstract, Fukuda, Japanese Pat. Pub. No. H1-245518, translation date: May 6, 2015, Espacenet, all pages.*

(Continued)

*Primary Examiner* — Fernando L Toledo
*Assistant Examiner* — Victoria K Hall
(74) *Attorney, Agent, or Firm* — Amerson Law Firm, PLLC

(57) ABSTRACT

A method of forming an inductor in a crystal semiconductor layer is provided, including generating an ion beam, directing the ion beam to a surface of the crystal semiconductor layer, applying a magnetic field to the ion beam to generate a helical motion of the ions and forming a three-dimensional helical structure in the crystal semiconductor layer by means of the ions of the ion beam.

17 Claims, 4 Drawing Sheets

(56) References Cited

U.S. PATENT DOCUMENTS

| | | | |
|---|---|---|---|
| 2005/0025445 A1* | 2/2005 | Schoroeder et al. | 385/137 |
| 2005/0064137 A1* | 3/2005 | Hunt et al. | 428/131 |
| 2009/0045176 A1* | 2/2009 | Wawers et al. | 219/121.67 |
| 2009/0224180 A1* | 9/2009 | Aigner | 250/492.22 |
| 2010/0284502 A1* | 11/2010 | Piefer | 376/190 |
| 2012/0086102 A1* | 4/2012 | Hofmann et al. | 257/531 |
| 2012/0235779 A1* | 9/2012 | Baram et al. | 336/200 |
| 2013/0143381 A1* | 6/2013 | Kikukawa | 438/381 |
| 2014/0147624 A1* | 5/2014 | Streltsov et al. | 428/138 |
| 2014/0204548 A1* | 7/2014 | Sekine et al. | 361/761 |
| 2014/0225706 A1* | 8/2014 | Doyle et al. | 336/84 M |

FOREIGN PATENT DOCUMENTS

| | | | | |
|---|---|---|---|---|
| JP | H2-73626 | * | 3/1990 | H01L 21/265 |
| JP | H3-259514 | * | 11/1991 | H01L 21/265 |
| JP | H5-291066 | * | 11/1993 | H01F 41/02 |
| JP | H9-129458 | * | 5/1997 | H01F 30/00 |
| JP | 2004-309204 | * | 11/2004 | G01N 25/00 |
| JP | 2006-303360 | * | 11/2006 | H05K 1/11 |
| JP | 2009-33152 | * | 2/2009 | H01F 41/04 |
| WO | WO 96/28838 | * | 9/1996 | H01J 37/302 |
| WO | WO 2013/101131 | * | 7/2013 | H01L 27/04 |

OTHER PUBLICATIONS

Machine translation, Abstract, Ishizaka, Japanese Pat. Pub. No. H1-316472, translation date: May 6, 2015, Espacenet, all pages.*
Machine translation, Ibata, Japanese Pat. Pub. No. H9-129458, translation date: May 8, 2015, Espacenet, all pages.*
Machine translation, Kitaoka, Japanese Pat. Pub. No. 2004-309204, translation date: May 8, 2015, Espacenet, all pages.*
Machine translation, Matsuzawa, Japanese Pat. Pub. No. H5-291066, translation date: May 8, 2015, Espacenet, all pages.*
Machine translation, Namekawa, Japanese Pat. Pub. No. 2009-33152, translation date: May 8, 2015, Espacenet, all pages.*
Machine translation, Yamamoto, Japanese Pat. Pub. No. 2006-303360, translation date: May 8, 2015, Espacenet, all pages.*
Machine translation, Abstract, Mizutani, Japanese Pat. Pub. No. H3-259514, translation date: May 6, 2015, Espacenet, all pages.*
Machine translation, Abstract, Yamakawa, Japanese Pat. Pub. No. H2-73626, translation date: May 6, 2015, Espacenet, all pages.*

* cited by examiner

INTEGRATED INDUCTOR

BACKGROUND OF THE INVENTION

1. Field of the Invention

Generally, the present disclosure relates to the field of integrated circuits and semiconductor devices, and, more particularly, to the formation of integrated inductors in the context of CMOS manufacturing techniques.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, CMOS technology, millions of N-channel transistors and P-channel transistors are formed on a substrate including a crystalline semiconductor layer.

In some aggressively scaled transistor elements, which may have channel lengths on the order of approximately 10-20 nm or less, gate structures that include a so-called high-k dielectric gate insulation layer and one or more metal layers that function as the gate electrode have been implemented that provide significantly enhanced operational characteristics over the heretofore more traditional silicon dioxide/polysilicon gate structure configurations.

In principle, there are two well-known processing methods for forming a planar or 3D transistor with a high-k/metal gate (HK/MG) structure: (1) the so-called "gate-last" or "replacement gate" technique; and (2) the so-called "gate-first" technique. In the replacement gate technique, a so-called "dummy" or sacrificial gate structure is initially formed and remains in place as many process operations are performed to form the device, e.g., the formation of doped source/drain regions, performing an anneal process to repair damage to the substrate caused by the ion implantation processes and to activate the implanted dopant materials. At some point in the process flow, the sacrificial gate structure is removed to define a gate cavity where the final HK/MG gate structure for the device is formed. In general, using the "gate-first" technique involves forming a stack of layers of material across the substrate, wherein the stack of materials includes a high-k gate insulation layer, one or more metal layers, a layer of polysilicon and a protective cap layer, for example, silicon nitride. Thereafter, one or more etching processes are performed to pattern the stack of materials to thereby define the basic gate structures for the transistor devices.

It is important to note that, in general, the formation of transistor devices is part of an overall integrated processing of a variety of devices, such as transistors, fuses, resistors, etc. Analog electronic circuits, especially those operating at radio frequency, may include inductors and transformers for filtering, frequency mixing, oscillators, interstage radio frequency coupling and high frequency pulse coupling. Transformers are adapted to pass mating current (AC) signals and block direct current (DC). Inductors and transformers have been fabricated in many forms, from large iron core transformers used at power frequencies to air core inductors used at radio frequencies. Radio frequency inductors and transformers have been enclosed in metal cans, non-conductive coil forms, open construction, fabricated onto a printed circuit board and the like.

More recently, with the advent of integrated circuits and electronic miniaturization, the need arose to reduce the size of external discrete components necessary with an integrated circuit product, preferably elimination of any discrete components was a primary goal. More and more, formerly discrete components were fabricated onto integrated circuits, i.e., resistors, capacitors and inductors, for both size and cost reasons. Inductors were especially a problem because of the physical size and geometry normally required for an effective inductor over a desired range of frequencies. In general, inductors are important components in many of the building blocks in wireless communication systems, such as RF bandpass fillers, oscillators, impedance matching networks and/or emitter degeneration circuits. Wireless communication standards place stringent requirements on performance and operating parameters, such as noise interference/immunity and power consumption. To accommodate the stringent requirements, high Q inductors are needed.

An inductor fabricated on an integrated circuit substrate generally has been formed in the shape of a spiral coil structure in a single metal layer on an insulation layer using typical integrated circuit fabrication techniques. This spiral coil structure requires a substantial area of the silicon integrated circuit substrate, typically, for example, 200 $\mu$m×200 $\mu$m. The spiral coil structure also suffers from parasitic capacitive influence from the integrated circuit substrate on which it is fabricated. Fabrication on an integrated circuit substrate of an efficient transformer (two inductors electromagnetically coupled together) is also extremely difficult using spiral coil structure shapes because of the physical size required and the inherent parasitic capacitance which may render the resulting transformer structure inefficient or ineffective for a desired purpose.

Thus, there is, particularly, a need for the formation of a high Q inductor with reduced spatial dimensions as compared to conventionally BEOL manufactured inductors comprising planar circular metal strips. More particularly, there is a need to integrate the formation of space-saving inductors in the overall CMOS manufacturing process.

In view of the situation described above, the present disclosure provides techniques that allow for the formation of space-saving inductors within the CMOS manufacturing process, in particular in the context of the gate-first manufacturing flow of HK/MG transistor devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method of the formation of an inductor in a crystal semiconductor layer includes the steps of generating an ion beam, directing the ion beam to a main surface of the crystal semiconductor layer, applying a magnetic field to the ion beam to generate a helical motion of the ions, and forming a three-dimensional helical structure in the crystal semiconductor layer by means of the ions of the ion beam. Particularly, the ion beam may be directed to the surface of the crystal semiconductor layer under some tilt angle. The magnetic field is present in and above the crystal semiconductor layer and may be directed substantially perpendicular to the surface of the crystal semiconductor layer. The magnetic field may be constant in time and spatially homogeneous in and above the crystal semiconductor layer.

The semiconductor layer may be made of polysilicon. According to one example, the penetrated ions result in a highly doped semiconductor layer and form a three-dimensional electromagnetic coil. According to another example, the penetrating ions result in localized amorphization of the crystal semiconductor layer. The amorphized material may be removed, for example, by chemical wet etching, and the resulting hollow space may be filled by some metal material, thereby forming an electromagnetic coil made of metal.

The formation of the inductor may be achieved in the context of the gate-first manufacturing flow of HK/MG transistor devices. Thus, a method of forming an inductor in a crystal semiconductor layer is provided, including the steps of forming a shallow trench isolation in a semiconductor substrate, forming a dielectric layer on the semiconductor substrate and the shallow trench isolation, forming a metal layer on the dielectric layer, forming a crystal semiconductor layer on the metal layer, and generating an ion beam and directing the generated ion beam to a main surface of the crystal semiconductor layer over the shallow trench isolation only. Furthermore, this method includes applying a magnetic field to the ion beam to generate a helical motion of the ions and forming a three-dimensional helical structure in the crystal semiconductor layer over the shallow trench isolation by means of the ions of the ion beam. The stack of the dielectric layer, metal layer and crystal semiconductor layer formed on the semiconductor substrate is etched in order to form a transistor device.

Accordingly, a semiconductor device is provided that includes a FET (either an N-channel or P-channel field effect transistor) comprising a channel region and source and drain regions formed in a semiconductor substrate, a gate dielectric formed on the semiconductor substrate, a metal layer formed on the gate dielectric, a polysilicon layer formed on the metal layer and a silicide layer formed on the polysilicon layer, a shallow trench isolation formed adjacent to the source region or the drain region of the FET, and an inductor comprising a first plate, a second plate and an electromagnetic coil and formed over the shallow trench region, wherein the first plate of the inductor is made of the same material as the metal layer of the FET, the second plate of the inductor is made of the same material as the silicide layer of the FET, and the electromagnetic coil of the inductor is formed by ions doped in a form of a three-dimensional helical structure in the same material as the polysilicon layer of the FET or by a metal material formed in the form of a three-dimensional helical structure in the same material as the polysilicon layer of the FET. In particular, the FET may be a P-channel FET separated from an N-channel FET by the shallow trench isolation over which the inductor is formed.

BRIEF DESCRIPTION OF THE DRAWINGS

The disclosure may be understood by reference to the following description taken in conjunction with the accompanying drawings, in which like reference numerals identify like elements, and in which.

Figure 1A:
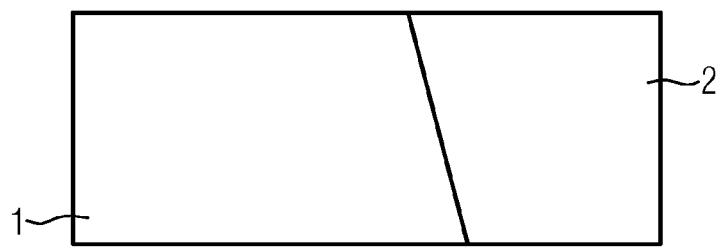
FIGS. 1a-1f illustrate a method for the formation of an inductor according to an example of the present invention.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various embodiments of the invention are described below. In the interest of clarity, not all features of actual implementations are described in the specification. It will, of course, be appreciated that, in the development of any such actual embodiments, numerous implementations and specific decisions must be made to achieve the developer's specific goals, such as compliance with system-related and business-related constraints, which will vary from one implementation to another. Moreover, it will be appreciated that such a development might, therefore, be complex and time consuming, but would nevertheless be a routine undertaking for those of ordinary skill in the art having the benefits of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it will be apparent that the embodiments of the disclosure may be practiced without the specific details. In order to avoid obscuring the present disclosure, some well-known circuits, system configurations, structure configurations and process steps are not disclosed in detail.

As will be readily apparent to those skilled in the art upon a complete reading of the present application, the present methods are applicable to a variety of technologies, for example, NMOS, PMOS, CMOS, etc., and is readily applicable to a variety of devices, including, but not limited to, integrated circuits comprising inductors.

The present disclosure provides methods for the integrated formation of an inductor within MOS gate-first processing. A three-dimensional coil may be formed in a semiconductor layer comprising, for example, silicon. A space-saving high Q inductor may, thus, be formed.

An example of an inventive method for the formation of an inductor is illustrated in FIGS. 1a-1f. A semiconductor substrate 1 is provided. The semiconductor substrate 1 may comprise a semiconductor layer, which in turn may be comprised of any appropriate semiconductor material, such as silicon, silicon/germanium, silicon/carbon, other II-VI or III-V semiconductor compounds and the like. The semiconductor layer may comprise a significant amount of silicon due to the fact that semiconductor devices of high integration density may be formed in volume production on the basis of silicon due to the enhanced availability and the well-established process techniques developed over the last decades.

However, any other appropriate semiconductor materials may be used, for instance, a silicon-based material containing other iso-electronic components, such as germanium, carbon and the like. The semiconductor substrate 1 may be a silicon substrate, in particular a single crystal silicon substrate. Other materials may be used to form the semiconductor substrate 1, such as, for example, germanium, silicon germanium, gallium phosphate, gallium arsenide, etc. Furthermore, the semiconductor substrate 1 may define an SOI (silicon-on-insulator) configuration.

In and on the semiconductor substrate 1, a plurality of transistor devices may be formed. The transistor devices may be separated from each other by insulation regions, in particular, shallow trench isolations. A shallow trench is formed in the semiconductor substrate 1 and filled with some (field) oxide. FIG. 1a shows oxide region 2 that may comprise or consist of silicon dioxide and separates two active regions of the semiconductor substrate 1 from each other. FIG. 1a only shows one active region left of the oxide region 2 where a FET is to be formed.

Figure 1B:
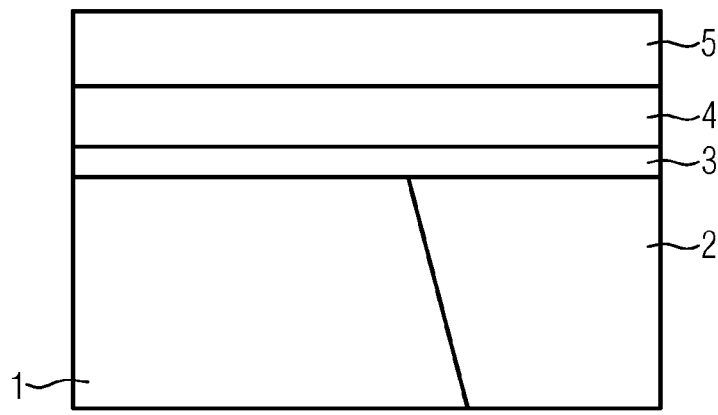

Next, a stack of layers of different materials is formed above the semiconductor substrate 1 and the oxide region 2. As is shown in FIG. 1b, the stack of materials, in principle, may include a high-k gate isolation layer 3, one or more metal layers 4 and a layer of (undoped) polysilicon 5. The polysilicon layer 5 may have a thickness of 50-80 nm, for example. The high-k gate isolation layer 3 may be formed of a silicon oxide-based material, such as a silicon oxynitride and the like, in principle. The high-k isolation layer 3 may include or consist of tantalum oxide, hafnium oxide, titanium oxide or hafnium silicates, for example. In particular, the high-k gate isolation layer 3 may have a permittivity k of at least 20 or 30. Furthermore, in the HK/MG technology, a relatively thin "work function metal" layer (not shown in FIG. 1b) that allows for adjusting the voltage threshold of the FET to be manufactured in and above the semiconductor substrate 1 may be formed between the high-k gate isolation layer 3 and the one or more metal layers 4 functioning as a metal gate in the completed FET.

One or more etching processes may be performed to pattern the stack of materials formed over the semiconductor substrate 1 to thereby define a basic gate structure for an N-channel or P-channel transistor device. According to one example, before patterning the gate stack, a mask layer 6 is formed over the semiconductor substrate 1 and atop of the polysilicon layer 5 (see FIG. 1c). The region of the polysilicon layer 5 formed over the oxide region 2 is exposed by the mask layer 6.

Figure 1C:
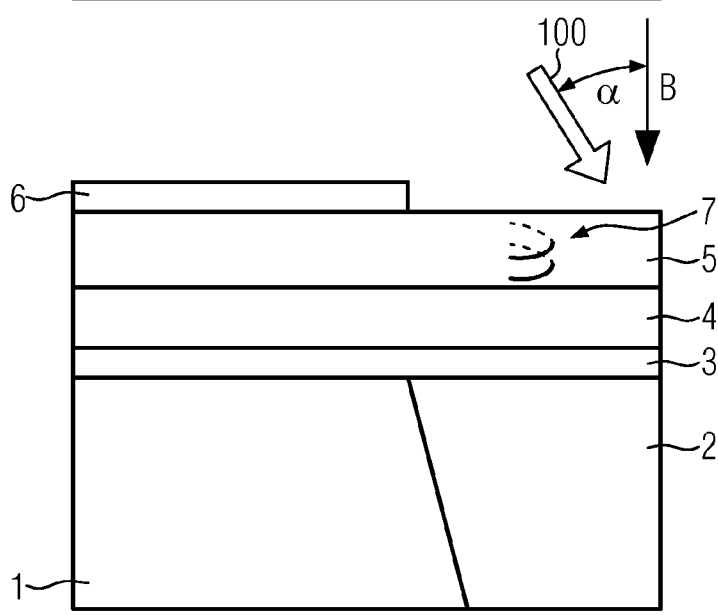

As illustrated in FIG. 1c, an ion beam 100 is directed towards the exposed polysilicon layer 5 over the oxide region 2. The ion beam 100 is directed towards the surface of the exposed polysilicon layer 5 under a tilt angle $\alpha$ of 10-40° with respect to an axis perpendicular to the surface of the exposed polysilicon layer 5, for example. The ion beam 100 may comprise typical implant ions, for example, boron, arsenic or phosphorous ions. A gyro motion of the ions of the ion beam 100 is caused by the application of a magnetic field B exerting a Lorentz force on the ions. In the shown example, the magnetic field is directed perpendicular to the surface of the exposed polysilicon layer 5. The magnetic field B may be constant in time and spatially homogeneous in and above the region of the exposed polysilicon layer 5. For example, the magnetic field has a strength in the range of mT or T.

The radius of the gyro motion of the ions depends on the magnetic field strength and, thus, for mT and T, respectively, gyro radii in the range of some mm to some µm result, for example. In fact, the gyro radius $r_G$ of an ion of the ion beam 100 is determined by $r_G=(m\, v_{perp})/(q\, B)$, where B denotes the magnetic field strength and m, q and $v_{perp}$ denote the mass, electric charge and velocity perpendicular to the magnetic field of the ion. The ion has a velocity given as the sum $v=v_{par}+v_{perp}$, where $v_{par}$ is the component of the velocity v parallel to the magnetic field, and $v_{perp}=v \sin \alpha$ is the velocity perpendicular to the magnetic field. The ion velocity and, thereby, the gyro radius can be controlled by the ion implantation energy $E_{imp}=0.5\, m\, v^2$. Suitable implantation energies lie in the range of a few keV to a few 100 keV. For example, boron ions may be implanted at implantation energies of about 3-20 keV, arsenic ions may be implanted at implantation energies of about 15-100 keV, and phosphorous ions may be implanted at implantation energies of about 9-60 keV.

The ion beam may cause a highly doped coil trace 7 in the polysilicon 5 over the oxide region 2. After performing an activation anneal, an electromagnetic coil with a shape corresponding to the trace 7 is formed in the polysilicon 5 over the oxide region 2. The lateral dimension of the coil is determined by the gyro radii of the ions of the ion beam 100. After appropriately contacting the metal layer 4 below the polysilicon 5, the electromagnetic coil can work as a bottom plate of the eventually completed inductance obtained by the subsequent processing steps. The activation anneal process may be a standard activation anneal used to activate the implanted dopants and to re-crystallize the damaged silicon carried out at a temperature of about 1000-1100° C. for a few seconds (for example, 1-10 s).

Figure 1D:
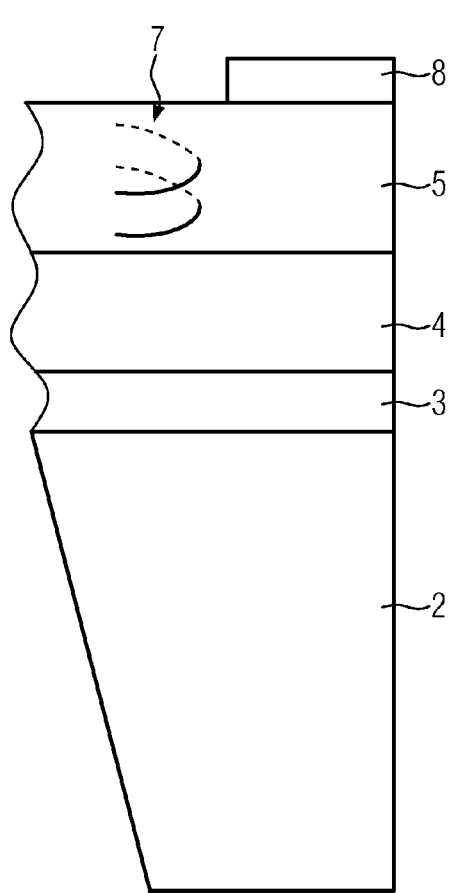
Figure 1E:
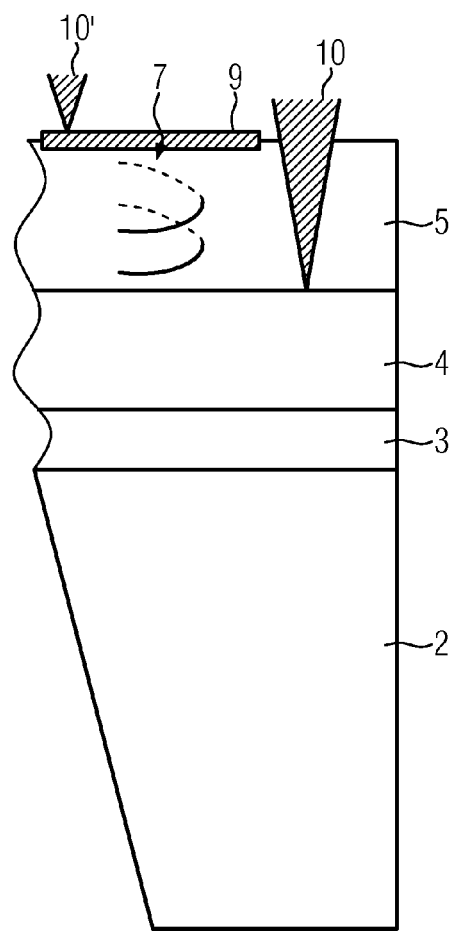

FIG. 1d (restricted to the stack comprising the coil and formed above the oxide region 2) shows a further manufacturing step wherein a mask layer 8 is formed over a lateral region adjacent to the coil 7. The exposed region of the polysilicon 5 is subjected to a silicidation process to form a silicide layer 9 (FIG. 1e). The silicide layer 9 may be formed, for instance, by depositing an appropriate refractory metal and initiating a silicidation process on the basis of an appropriate heat treatment.

The silicide layer 9 may be formed on the basis of refractory metals, such as nickel, platinum and the like, that may be deposited and may be converted into a metal silicide by performing an appropriate heat treatment, for example, in the form of a rapid thermal anneal. Thereafter, any non-reacted metal material may be removed on the basis of well-established selective etch techniques, wherein additional heat treatments for stabilizing the overall characteristics may follow, if required. A desired thickness of the silicide layer 9 may be obtained in a highly controllable manner.

After removal of the mask layer 8 prohibiting the formation of a silicide layer of the masked region of the polysilicon 5, an opening is formed through the polysilicon 5 and filled with an appropriate contact material, for example, a metal, in order to form contact 10 to the metal layer 4 functioning as a bottom plate for the completed inductance (see FIG. 1e). Similarly, the silicidation layer 8, functioning as a top plate of the completed inductance, is contacted by a contact 10'.

Figure 1F:
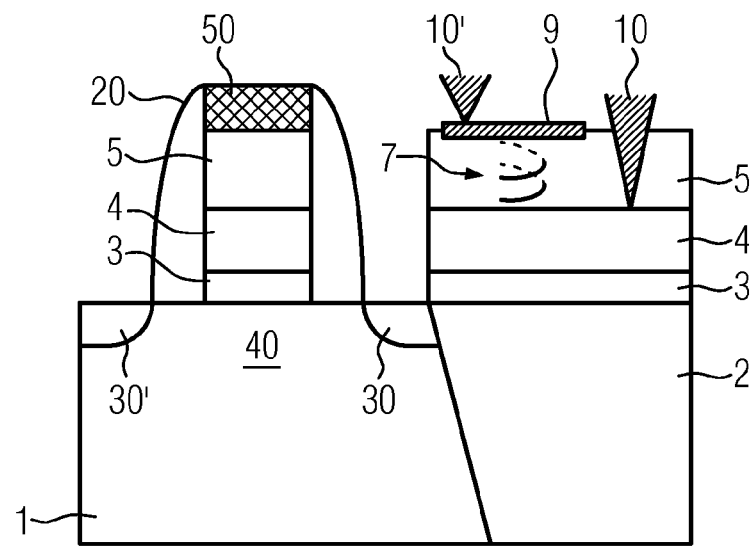

It is noted that the silicidation process carried out for forming the silicidation layer 9 (top plate of the inductor) may be integrated in a silicidation process for forming a silicidated gate and/or silicidated drain and source regions of a FET formed in and on the semiconductor substrate 1 shown in FIGS. 1a-1c. FIG. 1f illustrates a configuration comprising an N-channel or P-channel FET and an inductor. The FET comprises the gate dielectric 3 and metal layer 4 and polysilicon layer 5 that represent the gate electrode. Sidewall spacers 20 are formed at sidewalls of the gate of the FET. The sidewall spacers 20 may be formed, for example, of silicon nitride. Adjacent to the sidewall spacers 20, source 30 and drain 30' regions are formed by appropriate dopants. In principle, ion implantation in the context of an embedded silicon/germanium sequence may be carried out in order to form the source 30 and drain 30' regions.

Below the dielectric 3, the channel region 40 of the FET is located. The upper part 50 of the gate is silicidated. Moreover, the source 30 and drain 30' regions may also be silicidated for reducing the contact resistance. It is noted that a cap layer, for example, made of silicon nitride may be formed atop of the polysilicon layer 5 before doping the source 30 and drain 30' regions. During the silicidation process, the spacer structures 20 may reliably cover the sidewalls of the gate, thereby avoiding significant metal wraparound, such that enhanced controllability and uniformity of the silicidation process may be accomplished. The cap layer is removed before the silicidation of the gate electrode. In principle, a relatively thin layer of silicon dioxide may be deposited across the structure in order to protect the sidewall spacers 20 when the gate cap layer is removed. The oxide region 2 may separate the active region of the shown FET from the active region of another FET, either an N-channel or P-channel FET (not shown in FIG. 10. Within an efficient sequence of steps of overall integrated processing, both a FET according to the gate-first approach and a space-saving three-dimensional inductor may be formed.

Figure 2:
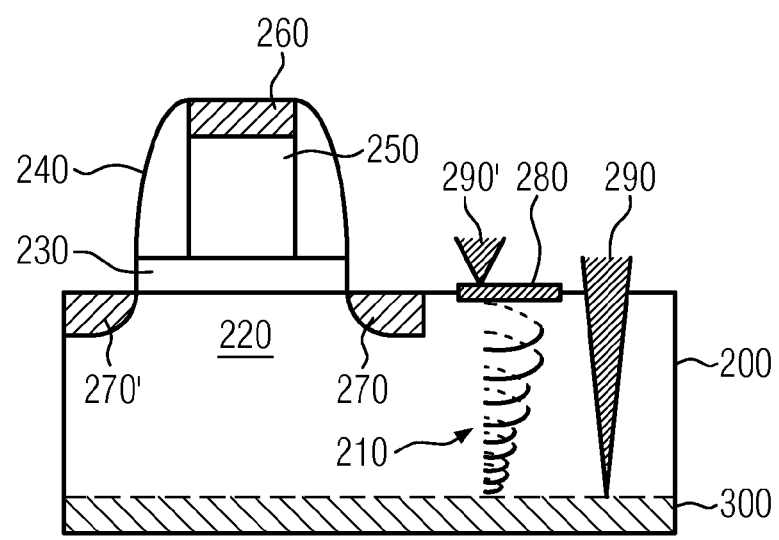
FIG. 2 illustrates a semiconductor device comprising a FET and an inductor manufactured according to an example of the present invention.

FIG. 2 illustrates another semiconductor device comprising a FET and an inductor manufactured according to an example of the present invention. Different from the example illustrated in FIGS. 1a-1f, the inductor is formed in a bulk semiconductor substrate 200. A three-dimensional coil 210 is formed in the semiconductor substrate 200 in a similar manner as described above with reference to FIG. 1c. An ion beam is directed to the upper main surface of the semiconductor substrate 200 and the movement of the ions is guided by a magnetic field directed substantially perpendicular to the surface of the semiconductor substrate 200. The three-dimensional coil 210 is formed in the same semiconductor substrate 200 in which the channel region 220 of the FET is formed. Moreover, the FET comprises a gate dielectric 230, sidewall spacers 240 and a gate electrode 250 with a silicided top region 260. Silicided source 270 and drain 270' regions are formed in the semiconductor substrate 200.

The semiconductor substrate 200 may comprise or consist of a polysilicon layer wherein the channel 220, source 270 and drain 270' regions of the FET as well as the three-dimensional coil 210 of the inductor are formed.

The gate dielectric 230 may be provided in the form of a high-k gate isolation layer made of a silicon oxide-based material, such as a silicon oxynitride and the like, in principle. The high-k insulation layer may include or consist of tantalum oxide, hafnium oxide, titanium oxide or hafnium silicates, for example. The gate electrode 250 of the FET may comprise one or more metal layers and a partially or fully silicided polysilicon layer.

The inductor comprises a silicide top plate 280 and contacts 290 and 290'. One of the contacts, 290, provides electrical contact to a bottom plate 300 of the inductor. The bottom plate 300 of the inductor may be formed by appropriate doping or may be provided by a metal plate formed below the semiconductor substrate 200. Moreover, the bottom plate 300 may extend below or within the semiconductor substrate 200 in the region of the inductor only or the bottom plate 300 may extend even below the FET. In the latter case, it may be formed similar to or even in the context of back gate formation, as known in the art.

In the examples shown in FIGS. 1c and 2, a three-dimensional helical structure 7, 210 for an inductance is formed in a semiconductor material 5, 200 by doping ions (for example, boron, arsenic or phosphorous ions) supplied by an ion beam 100 and guided by a magnetic field B directed substantially perpendicular to the exposed surface of the semiconductor material 5, 200. According to a further example, formation of the three-dimensional helical structure 7, 210 may be achieved differently.

Figure 3A:
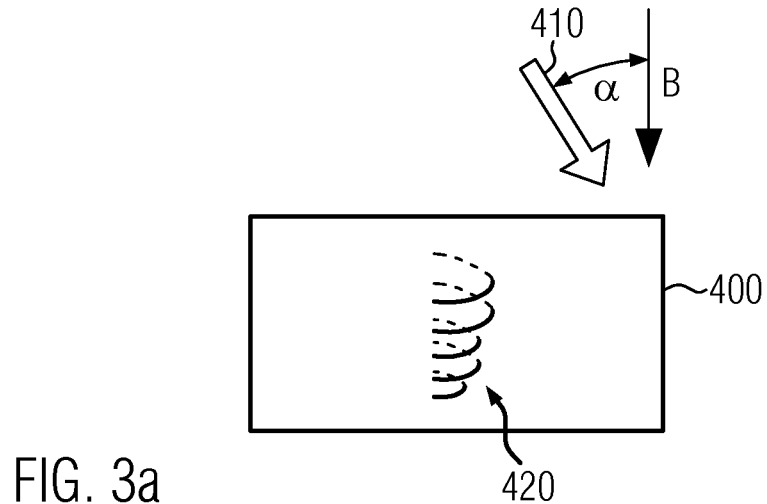
FIGS. 3a-3c illustrate an example for forming a three-dimensional coil in a semiconductor layer according to an example of the present invention.

Namely, as illustrated in FIG. 3a, an ion beam 410 may be directed towards a semiconductor material 400, for example, crystalline silicon, in order to merely destroy the semiconductor lattice and generate a spiraled path 420 of amorphous (amorphized) semiconductor material, for example, amorphous silicon. The ion beam 410 may comprise or consist of silicon, germanium or xenon ions and may be directed towards a main surface of the semiconductor material 400 under a tilt angle α of 10-40° with respect to an axis perpendicular to the surface of the semiconductor material 400. Kinetic energies of the ions of the ion beam 410 may lie in the range of 10 keV to a few 100 keV. For example, silicon ions may be directed to the surface of the semiconductor material 400 at energies of about 9-60 keV, germanium ions may be directed to the surface of the semiconductor material 400 at energies of about 15-100 keV and xenon ions may be directed to the surface of the semiconductor material 400 at energies of about 50-200 keV.

Figure 3B:
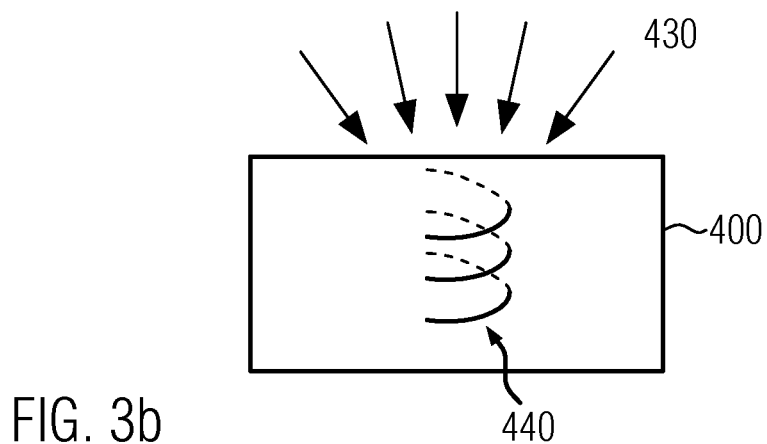
Figure 3C:
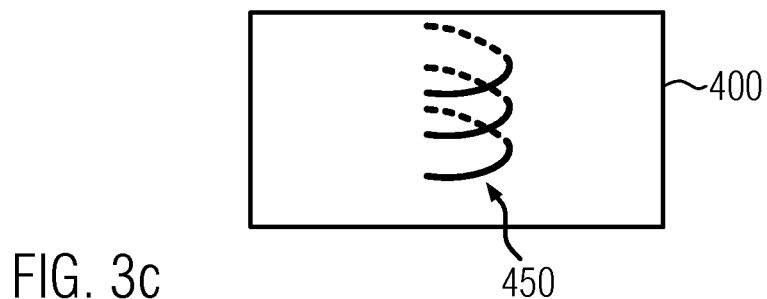

The ion beam directed to the semiconductor material 400 for localized amorphization of the same is guided by a magnetic field B directed substantially perpendicular to the surface of the semiconductor material 400. The magnetic field B extends in and above the semiconductor material 400 and may be constant in time and homogenous in space. Subsequent to the amorphization by the ion beam, the amorphous semiconductor material spiral is removed by wet chemical etching 430, for example, thereby generating a hollow spiral 440, as illustrated in FIG. 3b. The resulting hollow spiral 440 may then be filled by an appropriate material, for example, some metal material, in order to form a massive three-dimensional electromagnetic coil of an inductance device 450, as illustrated in FIG. 3c. By forming and contacting a top plate and a bottom plate as described with reference to FIGS. 1c, 1d and 2, formation of the inductance may be completed.

As a result, the present disclosure provides manufacturing techniques for semiconductor devices comprising inductances. Particularly, the provided manufacturing techniques allows for integrating the manufacture of a three-dimensional coil inductance within the gate-first processing of FET formation. A space-saving inductance may, thereby, be provided. As compared to the art, inductances with larger inductivities and comparable spatial dimensions or comparable inductivities with smaller spatial dimensions may be provided. Moreover, the inductance may be formed very close to logic devices, thereby reducing the parasitic effects as compared to the art.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an inductor in a crystal semiconductor layer, the method comprising:
generating an ion beam comprising of ions;
directing said ion beam to a surface of said crystal semiconductor layer;
applying a magnetic field to said ion beam to generate a helical motion of the ions; and
forming a three-dimensional helical structure in said crystal semiconductor layer by means of said ions of said ion beam, wherein said helical structure comprises ions of said ion beam penetrated into said crystal semiconductor layer.

2. The method of claim 1, further comprising performing an activation anneal treatment after formation of said three-dimensional helical structure.

3. The method of claim 1, further comprising forming a silicide layer on a top surface of said crystal semiconductor layer after the formation of said three-dimensional helical structure to provide an electrical contact to said three-dimensional helical structure.

4. The method of claim 1, further comprising forming said crystal semiconductor layer on a metal layer and forming a contact to said metal layer by forming an opening in said crystal semiconductor layer adjacent to and spaced apart from said three-dimensional helical structure and filling said opening with a contact material.

5. The method of claim 4, further comprising forming an isolation region in a semiconductor wafer and forming said metal layer above said isolation region.

6. The method of claim 5, further comprising forming a transistor device on said semiconductor wafer separated from said three-dimensional helical structure by said isolation region.

7. The method of claim 1, wherein said ion beam is directed to the surface of said crystal semiconductor layer under a tilt angle of 10-40° with respect to an axis perpendicular to the surface of said crystal semiconductor layer and the magnetic field is directed substantially parallel to the axis.

8. A method of forming an inductor in a crystal semiconductor layer, the method comprising:
forming a shallow trench isolation in a semiconductor substrate;
forming a dielectric layer on said semiconductor substrate and said shallow trench isolation;
forming a metal layer on said dielectric layer;
forming a crystal semiconductor layer on said metal layer;
generating an ion beam comprising ions and directing said generated ion beam to a surface of said crystal semiconductor layer over said shallow trench isolation only;
applying a magnetic field to said ion beam to generate a helical motion of the ions;
forming a three-dimensional helical structure in said crystal semiconductor layer over said shallow trench isolation by means of said ions of said ion beam; and
etching a stack of said dielectric layer, said metal layer and said crystal semiconductor layer formed on said semiconductor substrate to form a transistor device.

9. The method of claim 8, wherein said crystal semiconductor layer is made of polysilicon.

10. The method of claim 8, further comprising performing an activation anneal treatment after formation of said three-dimensional helical structure.

11. The method of claim 8, further comprising forming silicide regions atop of said crystal semiconductor layer over said semiconductor substrate and said shallow trench isolation.

12. The method of claim 11, wherein said silicide region of said semiconductor substrate and said silicide region over said shallow trench isolation are formed in one single processing step.

13. The method of claim 11, further comprising forming an electrical contact to said silicide region over said shallow trench isolation and another electrical contact through said crystal semiconductor layer adjacent to and spaced apart from said three-dimensional helical structure to said metal layer over said shallow trench isolation, thereby completing the inductor.

14. The method of claim 8, wherein said ion beam is directed to the surface of said crystal semiconductor layer under a tilt angle of 10-40° with respect to an axis perpendicular to the surface of said crystal semiconductor layer and said magnetic field is directed substantially parallel to the axis.

15. A semiconductor device, comprising
a FET comprising a channel region and source and drain regions formed in a semiconductor substrate, a gate dielectric formed on said semiconductor substrate,
a metal layer formed on said gate dielectric, a polysilicon layer formed on said
metal layer and a silicide layer formed on said polysilicon layer;
a shallow trench isolation formed adjacent to said source region or said drain region of said FET; and
an inductor comprising a first plate, a second plate and an electromagnetic coil and formed over said shallow trench isolation, wherein:
said first plate of said inductor is made of a same material as said metal layer of said FET;
said second plate of said inductor is made of a same material as said silicide layer of said FET; and
said electromagnetic coil of said inductor is formed by ions doped in a form of a three-dimensional helical structure in a same material as said polysilicon layer of said FET or by a metal material formed in a form of a three-dimensional helical structure in the same material as said polysilicon layer of said FET.

16. A method of forming an inductor in a crystal semiconductor layer, the method comprising:
forming an isolation region in a semiconductor wafer;
forming a metal layer above said isolation region;
forming said crystal semiconductor layer on said metal layer;
generating an ion beam comprising of ions;
directing said ion beam to a surface of said crystal semiconductor layer;
applying a magnetic field to said ion beam to generate a helical motion of the ions;
forming a three-dimensional helical structure in said crystal semiconductor layer by means of said ions of said ion beam; and
forming a contact to said metal layer by forming an opening in said crystal semiconductor layer adjacent to and spaced apart from said three-dimensional helical structure and filling said opening with a contact material.

17. The method of claim 16, further comprising forming a transistor device above said semiconductor wafer separated from said three-dimensional helical structure by said isolation region.

* * * * *

UNITED STATES PATENT AND TRADEMARK OFFICE
CERTIFICATE OF CORRECTION

PATENT NO. : 9,129,843 B1
APPLICATION NO. : 14/302880
DATED : September 8, 2015
INVENTOR(S) : Stefan Flachowsky et al.

Page 1 of 1

It is certified that error appears in the above-identified patent and that said Letters Patent is hereby corrected as shown below:

Claims

Col. 9, line 4 (claim 1, line 3), after "comprising" delete "of".

Col. 10, line 49 (claim 16, line 7), after "comprising" delete "of".

Signed and Sealed this
Nineteenth Day of January, 2016

Michelle K. Lee
*Director of the United States Patent and Trademark Office*